United States Patent [19]

Chang et al.

[11] Patent Number: 5,706,032
[45] Date of Patent: Jan. 6, 1998

[54] AMENDABLE STATIC RANDOM ACCESS MEMORY

[75] Inventors: Hsiao-Yueh Chang, Taipei; Lein-Hsing Lin, Taichung, both of Taiwan

[73] Assignee: United Microelectronics Corporation, Hsinchu, Taiwan

[21] Appl. No.: 573,042

[22] Filed: Dec. 15, 1995

[51] Int. Cl.$^6$ .................... G11C 17/00; G06F 11/20
[52] U.S. Cl. .................... 395/182.03; 395/182.03; 395/182.05; 395/182.06; 365/200; 371/102; 371/103
[58] Field of Search .................... 395/182.05, 182.06, 395/182.03; 371/10.2, 10.3; 365/200

[56] References Cited

U.S. PATENT DOCUMENTS

| | | | |
|---|---|---|---|
| 3,681,757 | 8/1972 | Allen et al. | 395/183.18 |
| 4,446,534 | 5/1984 | Smith | 365/200 |
| 4,523,313 | 6/1985 | Nibby, Jr. et al. | 365/200 |
| 4,527,251 | 7/1985 | Nibby, Jr. et al. | 395/182.06 |
| 4,933,908 | 6/1990 | Byers et al. | 365/200 |
| 5,051,994 | 9/1991 | Bluethman et al. | 365/200 |
| 5,134,584 | 7/1992 | Boler et al. | 365/200 |
| 5,253,354 | 10/1993 | MacDonald et al. | 371/10.2 |
| 5,526,317 | 6/1996 | McClure | 365/200 |

*Primary Examiner*—Robert W. Beausoliel, Jr.
*Assistant Examiner*—Luan C. Do
*Attorney, Agent, or Firm*—Fish & Richardson P.C.

[57] ABSTRACT

The present invention discloses an amendable static RAM, which can be modified from a high-priced corrupt 32K×36 one to a correctly functioning 32K×32 one. In each memory block, at least a common sense amplifier is employed as an amendable local sense amplifier. Each amendable local sense amplifier is coupled to a corresponding amendable common sense amplifier and by a switching circuit following the amendable common sense amplifier to all I/O buffers in the same memory block. When the static RAM works well and does not require amendment, the switching circuit is set to a normal condition that the amendable common sense amplifier is coupled to a corresponding amendable I/O buffers. When the static RAM is corrupt and requires modification, the switching circuit is set to an amendable condition wherein the amendable common sense amplifier is coupled to a normal I/O buffer corresponding to the corrupt memory column.

8 Claims, 3 Drawing Sheets

5,706,032

AMENDABLE STATIC RANDOM ACCESS MEMORY

BACKGROUND OF THE INVENTION

1. Field of the Invention

The present invention in general relates to a random access memory (RAM). More specifically, the present invention relates an amendable static RAM structure, which can be used to salvage a damaged static RAM, such as a 32K×36 RAM, as a correctly functioning RAM of reduced capacity, such as a 32K×32 RAM. Such a scheme should improve product yield.

2. Description of Related Art

Static RAMs, because of their high-speed characteristics, are often used as buffering devices, such as cache memories, located between the CPU of the computer system and other memory devices, such as dynamic RAMs. Static random access memory with more bits is the key product of the current market because such a RAM has a relatively small influence on the operation speed of the computer system. There are many packaging configurations for the static RAM, such as 32K×32, 32K×36, 32K×64, and 32K×72, wherein the 32K×36 and 32K×72 types are usually used in workstations and the 32K×32 and 32K×64 types are used mainly in personal computers. Packaging configurations having higher memory capacity are usually in the form of modular packaging.

When the size of a chip is large, the yield of a single wafer that can produce many chips will decrease due to the normal distribution of defects. In the semiconductor industry, low-yield implies high-cost. Thus, some actions must be taken to increase the chip yield if costs are to be minimized. One approach is to add some accessory circuitry into the conventional construction of the static RAM chip, such as row-redundancy or column-redundancy circuits, to replace corrupt rows or columns of the chip. The row-redundancy technique that requires less chip area and simpler construction is widely used in current memory products. However, the column-redundancy construction, owing to its complexity and large chip area, is seldom used. Therefore, if some errors occur in the I/O ports of the memory columns, the static RAM chip must be discarded and can not be salvaged.

SUMMARY OF THE INVENTION

Based on such circumstances, the object of the present invention is to provide an amendable static RAM, which can replace the damaged memory column of the original chip with some preserved memory column by an accessory circuit, thereby obtaining useful static RAMs with reduced capacity. For example, we can transform a 32K×36 static RAM into a 32K×32 static RAM.

In view of the above-mentioned object, the present invention is intended to provide an amendable static RAM, which can be modified to a reduced static RAM when a memory column of the original amendable static RAM is corrupt. The amendable static RAM chip is divided into a plurality of memory blocks for storing data. Each memory block is divided into a plurality of memory sections. The amendable RAM further comprises a plurality of local sense amplifiers for amplifying data from the static RAM cells, a plurality of common sense amplifiers for amplifying data from the local sense amplifiers, a plurality of buffers for the data from the common sense amplifiers. Each memory section comprises the same number of local sense amplifiers and the local sense amplifiers in each memory section can be divided into normal and amending ones. Each memory block comprises the same number of common sense amplifiers and the common sense amplifiers in each memory block can be divided into normal and amending ones. Each normal common sense amplifier receives data coming from all corresponding normal local sense amplifiers in each memory section of the same memory block and each amending common sense amplifier receives data coming from the corresponding amending local sense amplifier in the corresponding amending memory section of the same memory block. Each memory block comprises the same number of the I/O buffers. Each I/O buffers receives data coming from the corresponding common sense amplifier in the same memory block. Further, the amendable static RAM comprises a plurality of switching circuits for switching the interconnection between the amending common sense amplifiers and the I/O buffers. Input terminals of each switching circuits are coupled to the corresponding amending common sense amplifier and output terminals, then to the I/O buffers in the same memory block.

When the original static RAM is complete, the output terminals of the switching circuits can switch to the corresponding I/O buffers. When the original static RAM is corrupt, the output terminals of the switching circuits corresponding to the same memory section of the corrupt static RAM can switch to the amending common sense amplifier corresponding to the corrupt static random access memory.

BRIEF DESCRIPTION OF THE DRAWINGS

A detailed description of an embodiment of the present invention is made with reference to the accompanying drawings, wherein.

DETAILED DESCRIPTION OF THE PREFERRED EMBODIMENT

The amendability of static RAMs in the present invention is achieved by adding auxiliary circuitry around the original static RAMs and will not affect the chip area. When a portion of the amendable static RAM is corrupt, we can replace these corrupt memories by some redundant columns designated in advance. In this embodiment, we assume that the capacity of the original static RAM is 32K×36 and that of the reduced RAM is 32K×32. However, the present invention is not limited to this case. Capacity transformations of 64K×36 to 64K×32, 64K×72 to 64K×64, 32K×72 to 32K64 and others conform to the spirit of the present invention.

Figure 1:
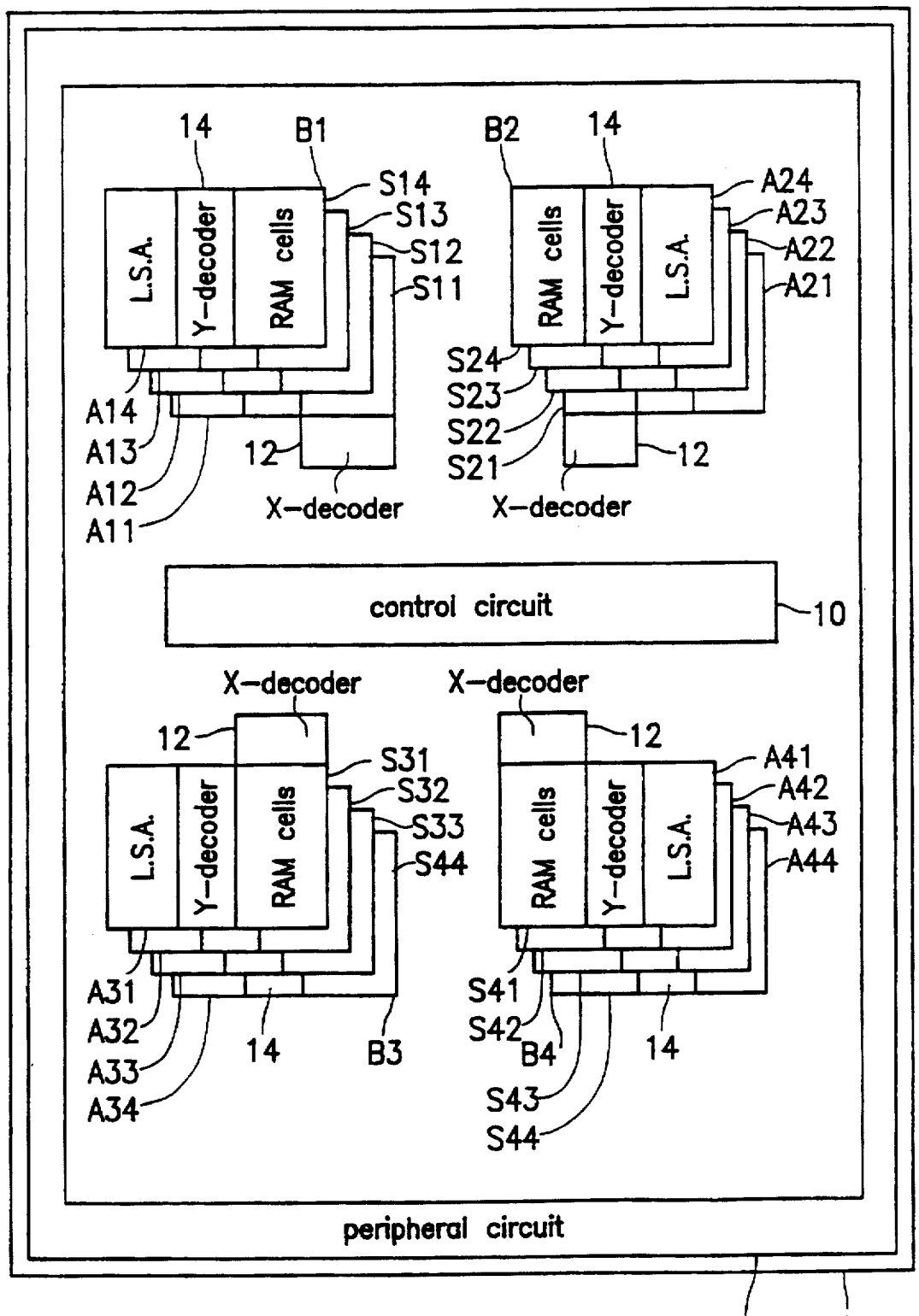
FIG. 1 is a plan view of an arrangement of the 32K×36 static RAM.

FIG. 1 is a plan view of an arrangement of the 32K×36 static RAM. In FIG. 1, the static RAM chip 1 comprises four memory blocks B1, B2, B3 and B4, each having 32K×9 capacity. Each memory block can be further divided into four memory sections. The memory block B1 comprises memory sections S11–S14, the memory block B2 comprises memory sections S21–S24, the memory block B3 comprises memory sections S31–S34, and the memory block B4 comprises memory sections S41–S44. Each memory section further comprises nine input/output ports corresponding to nine data lines, respectively. A memory set (9 bits) in one 32K×9 static RAM block can be picked up by means of output signals of an X-decoder 12 and a Y-decoder 14 and their contents will be transmitted to a peripheral circuit 16. Each memory block can supply 9 data bits and the whole static RAM chip can supply 36 data bits. A control circuit 10 is used to monitor and control the access action of the whole static RAM chip.

Each of the nine input/output ports in every memory section has its own dedicated local sense amplifier. In each memory block, the local sense amplifiers in the same position of the four memory sections are connected together to a common sense amplifier. Using the X-decoder 12 and the Y-decoder 14, data read from the memory block B1, B2, B3, and B4 can transmit to the output buffers through the local and common sense amplifier. In the configuration shown in FIG. 1, the X-decoder 12 is located in the middle of the chip 1 so that loading of the word lines can be effectively decreased. On the other hand, the path used to transfer information stored in the memory cells and including the local sense amplifier, the common sense amplifier, and the output buffer, will be shortened such that the data access time can be reduced.

Figure 2:
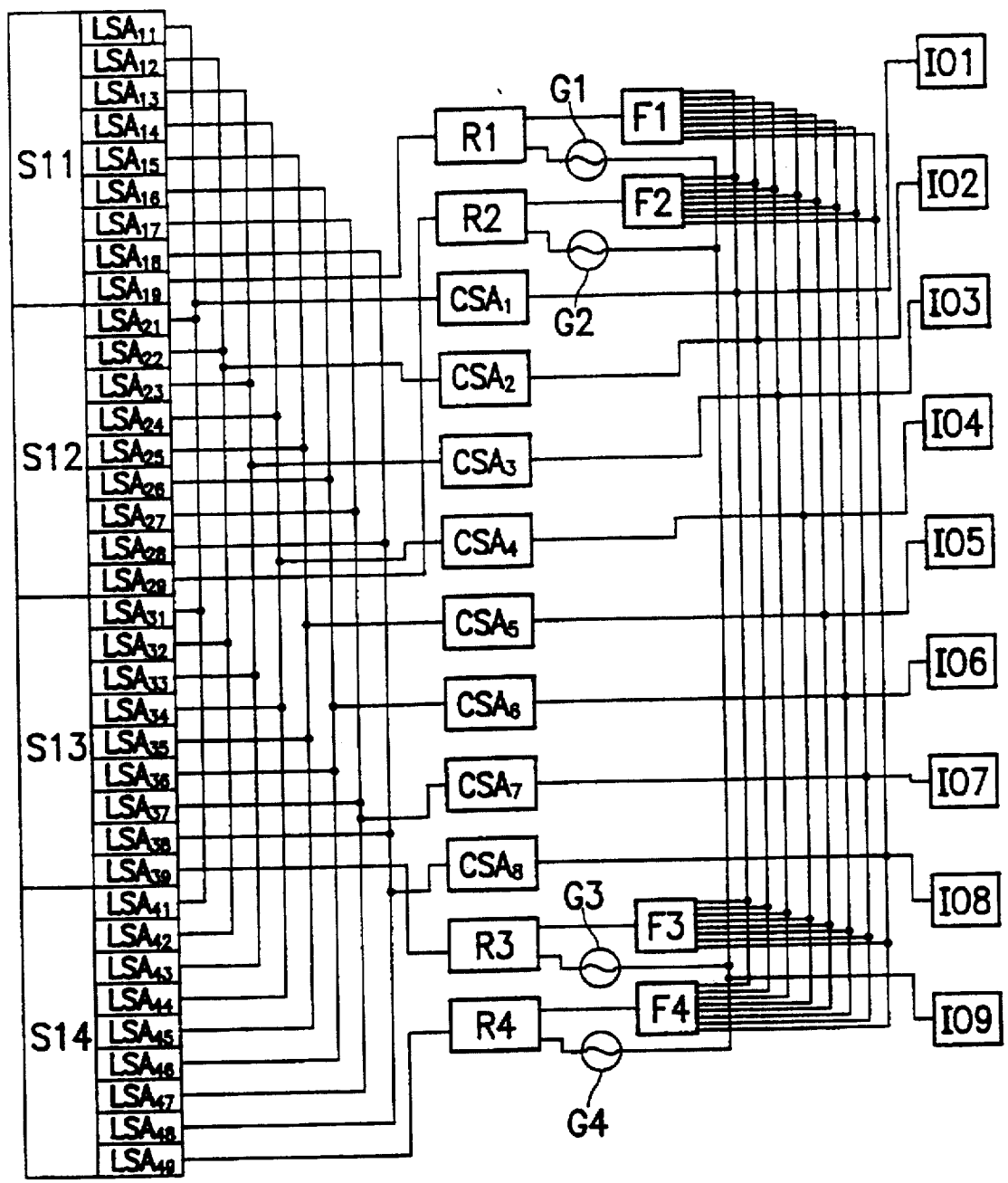
FIG. 2 is a circuit diagram of the first memory block in the embodiment according to the present invention.

FIG. 2 is a circuit diagram showing local sense amplifiers, common sense amplifier, and data I/O buffers in the memory block B1 of this embodiment according to the present invention. Memory sections S11, S12, S13, and S14 each have nine local sense amplifiers, wherein the memory section S11 comprises local sense amplifiers $LSA_{11}$-$LSA_{19}$, the memory section S12 comprises local sense amplifiers $LSA_{21}$-$LSA_{29}$, the memory section S13 comprises local sense amplifiers $LSA_{31}$-$LSA_{39}$, and the memory section S14 comprises local sense amplifiers $LSA_{41}$-$LSA_{49}$. In this embodiment, local sense amplifiers in each memory section can be divided into two groups: one group is the normal local sense amplifiers, like amplifiers $LSA_{11}$-$LSA_{18}$, $LSA_{21}$-$LSA_{28}$, $LSA_{31}$-$LSA_{38}$, and $LSA_{41}$-$LSA_{48}$, another group is the amending local sense amplifiers, like $LSA_{19}$, $LSA_{29}$, $LSA_{39}$, and $LSA_{49}$. The construction of the normal local sense amplifier in the present invention is the same as that in the conventional static RAM. The normal local sense amplifiers in the same position of the four memory sections, such as $LSA_{1i}$, $LSA_{2i}$, $LSA_{3i}$, $LSA_{4i}$, i=1~8, are connected together to the same common sense amplifier, such as $CSA_i$ and then to corresponding leads via the data I/O buffer IOi. Such a configuration is also identical to that in the conventional case and does not require any further discussion.

The amending local sense amplifiers, such as amplifiers $LSA_{19}$, $LSA_{29}$, $LSA_{39}$, and $LSA_{49}$, can serve as the ninth data line of their memory sections and be used to replace the corrupt local sense amplifiers when some errors occur in the static RAM chip. Each amending local sense amplifier in one memory block has its dedicated amending common sense amplifier, such as the amending common sense amplifier R1 to the amending local sense amplifier $LSA_{19}$, R2 to $LSA_{29}$, R3 to $LSA_{39}$, R4 to $LSA_{49}$. Outputs of the amending common sense amplifiers Rj (j=1~4) are, respectively, connected to switching circuits, which comprise fuse sets Fj (j=1~4) and fuses Gj (j=1~4). The fuse sets Fj can be switched to one of the data I/O buffers IO1~IO8 by means of an enable signal (not shown). The fuses Gj then are separably coupled to the data I/O buffer IO9, which is also controlled by the enable signal.

When all memory sections of the entire static RAM chip are complete, the amending local sense amplifiers $LSA_{19}$, $LSA_{29}$, $LSA_{39}$, and $LSA_{49}$ in this embodiment can normally work so that the entire static RAM chip really has 32K×36 memory size without any further amending action. In the normal case, the switching circuits, including the fuse sets Fj and fuses Gj and following the amending common sense amplifiers R1, R2, R3, and R4, should be coupled to the corresponding amending data I/O buffer IO9. The function of the fuse sets Fj must be disabled in the original configuration by means of the enable signal (i.e., in the disable state) so that data of memory cells can be fed into the data I/O buffer IO9 through the fuses Gj. There are no apparent differences in performance between the amendable static RAM in the present invention and the conventional one.

When some failures, due to particles contamination in the fabrication process, occur in the amendable static RAM chip, we can replace the local sense amplifiers coupled to the corrupt memory cells with the amending local sense amplifier. The new route starts from the amending local sense amplifier, crosses over the amending common sense amplifier and the fuse set in the switching circuits, and ends in the data I/O buffer that corresponds to the corrupt portion. If the memory cells coupled to the normal local sense amplifier $LSA_{14}$, for example, are impaired or damaged, the memory cells coupled to the amending local sense amplifier $LSA_{19}$ can be used as substitutes. The switching circuits following the amending common sense amplifier R1 must be modified to connect to the data I/O buffer IO4. First, we should blow out the fuse G1 with current and enable the fuse set F1 by the enable signal (i.e., in the enable state). Then we must blow out all fuses in the fuse set F1 except the fuse connecting to the data I/O buffer IO4. Therefore, the data output path (i.e., the local sense amplifier $LSA_{19}$ to the common sense amplifier R1 to the fuse set F1 and to the data I/O buffer IO4) can be established. That is, amplifier $LSA_{19}$ is in section S11 can replace bad one of $LSA_{11}$ to $LSA_{18}$, and so on for $LSA_{29}$ in section S12, $LSA_{39}$ in section S13 and $LSA_{49}$ in section S14. Although the amendable static RAM in this embodiment merely has one redundant data line in each memory section, the configuration with more redundant data lines also can be used to deal with cases where more than one data line is corrupt.

Figure 3:
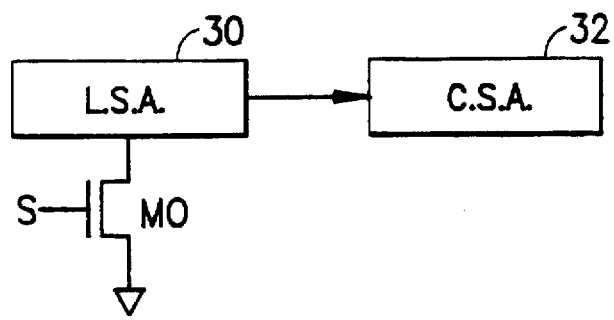
FIG. 3 (Prior Art) is a circuit diagram of the local sense amplifier and the common sense amplifier in the conventional technology.

When the redundant data line is used to substitute for a corrupt data line, conduction takes place between the local sense amplifier and the common sense amplifier corresponding to the corrupt data line. The current of the local sense amplifier is quite high, for example, about several mA, so that power consumption is very large. FIG. 3 shows a circuit diagram of the local sense amplifier and the common sense amplifier in the prior art. An NMOS transistor M0 serves as a current source of the local sense amplifier 30 and the conduction state of the NMOS transistor M0 is controlled by a control signal S, which is usually generated by a sectional decoder and a write enable signal. When the control signal S is in the high state, the local sense amplifier is coupled to the common sense amplifier 32. However, such a conduction state is not affected by the amending action. Therefore, the abandoned circuitry will still consume a relative amount of power. We can introduce a supplemental fuse circuit for controlling the connection or disconnection state between the local sense amplifier and its corresponding common sense amplifier, so that the local sense amplifier 30 can be completely disable after amending to prevent power consumption.

Figure 4:
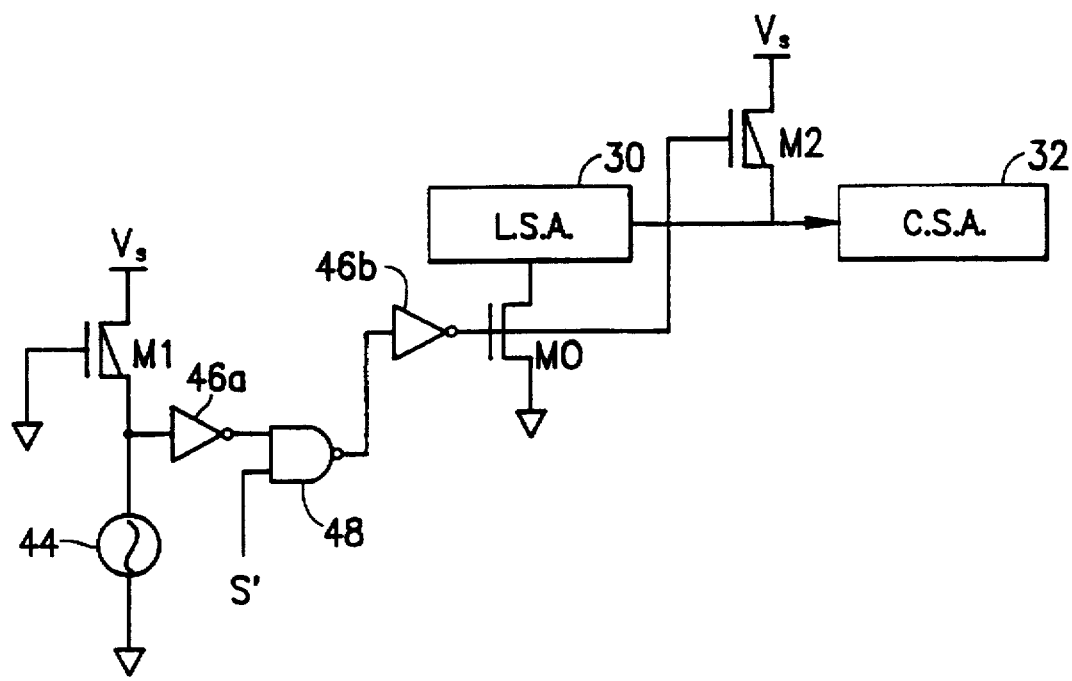
FIG. 4 is a circuit diagram of the local sense amplifier and the common sense amplifier in the present invention.

FIG. 4 is a circuit diagram of the local sense amplifier and the common sense amplifier in the present invention. When the fuse 44 conducts, the output terminal of the inverter 46a is in the high voltage state. Passing through the NAND gate 48 and the inverter 46b, the control signal S' will be present at the gate of the NMOS transistor M0, just as with the conventional case. Access time of the circuit shown in FIG. 4 will be increased by two gate delay times (the NAND gate 48 and the inverter 46b). However, the noise caused by the local sense amplifier can be reduced by delaying its turn-on. When the fuse 44 is blown out by the application of current, the output terminal of the inverter 46a is in the low voltage state, which is formed by the voltage source $V_S$ through the PMOS transistor M1. Such a signal together with the control signal S' feeds through the NAND gate 48 and the inverter 46b such that the gate of the NMOS transistor M0 is in the low voltage state, thus making the NMOS transistor M0 turn off. Therefore, in order to decrease the power consumption, the fuse 44 must be blown out after the amending action. A PMOS transistor M2 and its surrounding circuitry constitute a clamping circuit so that the unstable level condition can be avoided in the conduction wire between the local sense amplifier 30 and the common sense amplifier 32 while floating. The PMOS transistors M1 and M2 are small size transistors and their power consumption is low compared with the whole chip. Other circuitry that can be used as the clamping circuit shown in FIG. 4 is also included in the present invention.

The advantages of the present invention are:

1. The configuration of the amendable static RAM with column redundancy can effectively increase the product yield, especially for high-priced static RAM chips. Furthermore, a corrupt static RAM, such as a 32K×36 chip, can be reused and modified to a reduced one, such as 32K×32 chip. Such a scheme can reduce fabrication costs and improve productivity.

2. The accessory circuit added in the present invention, which can be located in the spacing in the peripheral area of the RAM chip, will not enlarge the chip area.

3. The same photomask can be utilized for the fabrication processes of 32K×36 static RAM and 32K×32 one, which is conducive to minimizing costs.

What is claimed is:

1. An amendable static random access memory, which can be modified to a reduced static random access memory when a portion of the original amendable static random access memory is corrupt, said amendable static random access memory divided into a plurality of memory blocks for storing data and each memory block divided into a plurality of memory sections, said amendable static random access memory further comprising:

a plurality of local sense amplifiers for amplifying data from the static random access memory, wherein each memory section comprises the same number of said local sense amplifiers and said local sense amplifiers in each memory section are divided into normal and amending ones;

a plurality of common sense amplifiers for amplifying data from said plurality of local sense amplifiers, wherein each memory block comprises the same number of said common sense amplifiers and said common sense amplifiers in each memory block are divided into normal and amending common sense amplifiers, as well as that each of the normal common sense amplifiers in that memory block receives data from a corresponding one of the normal local sense amplifiers in each of the memory sections of that memory block and each amending common sense amplifier in that memory block receives data coming from a corresponding amending local sense amplifier in a corresponding memory section of that memory block;

a plurality of I/O buffers for buffering the data from said plurality of common sense amplifiers, wherein each memory block comprises the same number of said I/O buffers and said I/O buffers in each memory block are divided into normal and amending I/O buffers, as well as that each of the normal I/O buffers in said memory block receives data coming from a corresponding one of the common sense amplifiers in that same memory block; and a plurality of switching circuits for switching a plurality of interconnections between said plurality of amending common sense amplifiers and said plurality of I/O buffers, wherein each of said plurality of switching circuits is coupled through its input terminal to a corresponding one of the amending common sense amplifiers in that memory block and through its output terminals to each of said normal I/O buffers in that memory block.

2. The amendable static random access memory set forth as claim 1, wherein the memory capacity of said original static random access memory is 32K×36 and that of said reduced static random access memory is 32K×32.

3. The amendable static random access memory set forth as claim 1, wherein the memory capacity of said original static random access memory is 64K×36 and that of said reduced static random access memory is 64K×32.

4. The amendable static random access memory set forth as claim 1, wherein the memory capacity of said original static random access memory is 32K×72 and that of said reduced static random access memory is 32K×64.

5. The amendable static random access memory set forth as claim 1, wherein the memory capacity of said original static random access memory is 64K×72 and that of the reduced static random access memory is 64K×64.

6. The amendable static random access memory set forth as claim 1, wherein said switching circuits comprises:

a fuse set which receives from the corresponding amending common sense amplifier and is coupled to all normal I/O buffers in the same memory block and controlled by an enable signal, when said enable signal is in the enable state, said fuse set can connect said amending common sense amplifier to the I/O buffers corresponding to the corrupt memory and disconnect all the others, when said enable signal is in the disable state, said fuse set can disconnect all I/O buffers;

a fuse which receives from the corresponding amending common sense amplifier and outputs to the corresponding amending I/O buffers in the same memory block.

7. The amendable static random access memory set forth as claim 1, further comprising a fuse circuit, which is used to control the connection or disconnection state between the local sense amplifier and its corresponding common sense amplifier.

8. The amendable static random access memory set forth as claim 1, further comprising a clamping circuit, which is used to prevent an unstable condition between the local sense amplifier and its corresponding common sense amplifier while floating.

* * * * *